United States Patent
Cheng

(10) Patent No.: US 8,289,069 B2
(45) Date of Patent: Oct. 16, 2012

(54) TOUCH APPARATUS

(75) Inventor: Jen-Wen Cheng, Tainan County (TW)

(73) Assignee: Himax Technologies Limited, Tainan (TW)

( * ) Notice: Subject to any disclaimer, the term of this patent is extended or adjusted under 35 U.S.C. 154(b) by 78 days.

(21) Appl. No.: 13/027,463

(22) Filed: Feb. 15, 2011

(65) Prior Publication Data
US 2012/0206189 A1 Aug. 16, 2012

(51) Int. Cl.
*H03K 17/945* (2006.01)
(52) U.S. Cl. ........... 327/517; 327/94; 327/337; 345/174
(58) Field of Classification Search .................. None
See application file for complete search history.

(56) References Cited

U.S. PATENT DOCUMENTS 5,783,951 A * 7/1998 Inoue et al. .................. 327/52
7,075,346 B1 * 7/2006 Hariman et al. ............. 327/116
2005/0001633 A1 * 1/2005 Okushima et al. .......... 324/658
2005/0134292 A1 * 6/2005 Knoedgen .................. 324/658
2008/0278453 A1 * 11/2008 Reynolds et al. ........... 345/173

* cited by examiner

*Primary Examiner* — Tuan T Tam
(74) *Attorney, Agent, or Firm* — J.C. Patents

(57) ABSTRACT

A touch apparatus including a touch capacitor and a touch control unit is provided. The touch control unit includes a signal sampling and saving unit, a switch unit, and a signal processing unit. The signal sampling and saving unit samples and saves a voltage on the touch capacitor during enable periods of a sample signal and a charge reset signal, so as to generate a touch voltage and a reset voltage respectively, and further generate an average voltage of the touch voltage and the reset voltage according to an equalization signal. The switch unit receives and transmits the touch voltage, the reset voltage, and the average voltage according to a first control signal. The signal processing unit couples the touch voltage, the reset voltage, the average voltage, and a common voltage according to a second control signal, so as to generate a first coupling voltage and a second coupling voltage.

8 Claims, 2 Drawing Sheets

TOUCH APPARATUS

BACKGROUND OF THE INVENTION

1. Field of the Invention

The present invention relates to a touch apparatus, in particular, to a touch apparatus capable of reducing noises during signal transmission and having a low static current.

2. Description of Related Art

With constant changes of technologies, most electronic devices such as a notebook computer, a mobile phone or a portable multimedia player are usually configured with a touch panel as a new generation input interface. The touch panel approximately includes a resistive type, a capacitive type, an infrared type, and an ultrasonic type. The resistive and capacitive panels are the most popular products.

In the capacitive type touch panel, when a finger or a conductive material approaches or touches the touch panel, a voltage on the capacitor of the touch panel changes. When the touch panel detects voltage changes on the capacitor, an internal circuit of the touch panel processes the voltage changes, so a position that the finger or the conductor material approaches or touches is judged, and a function operation corresponding to the touched position is performed.

However, during the process of processing the voltage on the capacitor, the signal is transmitted and processed in the internal circuit of the touch panel. Since a lot of noise components may be carried during the signal transmission, if the noises carried by the signal are not effectively processed in the touch panel, the signal may be distorted due to the noises, so misoperations might occur to the touch panel.

SUMMARY OF THE INVENTION

Accordingly, the present invention is directed to a touch apparatus, which effectively reduces noises during the signal transmission and has a low static current.

The present invention provides a touch apparatus, which has touch capacitors and includes a touch control unit. The touch control unit includes a signal sampling and saving unit, a switch unit, and a signal processing unit. The signal sampling and saving unit is coupled to the touch capacitor, so as to sample and save a voltage on the touch capacitor during an enable period of a sample signal, so as to generate a touch voltage, and sample and save a voltage on the touch capacitor during an enable period of a charge reset signal, so as to generate a reset voltage. The signal sampling and saving unit further generates an average voltage of the touch voltage and the reset voltage according to an equalization signal. The switch unit is coupled to the signal sampling and saving unit, so as to receive and transmit the touch voltage, the reset voltage, and the average voltage according to a first control signal. The signal processing unit is coupled to the switch unit, receives the touch voltage, the reset voltage, the average voltage, and a common voltage, and couples the touch voltage, the reset voltage, the average voltage, and the common voltage according to a second control signal, so as to generate a first coupling voltage and a second coupling voltage.

According to an embodiment of the present invention, the above signal sampling and saving unit includes a first switch, a first capacitor, a second switch, a second capacitor, a third switch, a first buffer, and a second buffer. A first terminal of the first switch receives the touch voltage, and a control terminal of the first switch is controlled by the sample signal, so as to decide to turn on or turn off the first switch. A first terminal of the first capacitor is coupled to a second terminal of the first switch, a second terminal of the first capacitor is coupled to a grounding terminal, and the first capacitor is used for saving the touch voltage. A first terminal of the second switch receives the reset voltage, and a control terminal of the second switch is controlled by the charge reset signal, so as to decide to turn on or turn off the second switch. A first terminal of the second capacitor is coupled to a second terminal of the second switch, a second terminal of the second capacitor is coupled to a grounding terminal, and the second capacitor is used for saving the reset voltage. A first terminal of the third switch is coupled to the first terminal of the first capacitor, a second terminal of the third switch is coupled to the first terminal of the second capacitor, and a control terminal of the third switch is controlled by the equalization signal, so the first terminal of the first capacitor and the first terminal of the second capacitor are coupled to each other to generate the average voltage. The first buffer is coupled to the first terminal of the first capacitor, so as to receive and output the touch voltage and the average voltage. The second buffer is coupled to the first terminal of the second capacitor, so as to receive and output the reset voltage and the average voltage.

According to an embodiment of the present invention, the above switch unit includes a fourth switch and a fifth switch. A first terminal of the fourth switch is coupled to the signal sampling and saving unit, a second terminal of the fourth switch is coupled to the signal processing unit, and a control terminal of the fourth switch is controlled by the first control signal, so as to decide to turn on or turn off the fourth switch to transmit the touch voltage and the average voltage. A first terminal of the fifth switch is coupled to the signal sampling and saving unit, a second terminal of the fifth switch is coupled to the signal processing unit, and a control terminal of the fifth switch is controlled by the first control signal, so as to decide to turn on or turn off the fifth switch to transmit the reset voltage and the average voltage.

According to an embodiment of the present invention, the above signal processing unit includes a third capacitor, a fourth capacitor, a sixth switch, a seventh switch, a third buffer, and a fourth buffer. A first terminal of the third capacitor receives the touch voltage and the average voltage. A first terminal of the fourth capacitor receives the reset voltage and the average voltage. A first terminal of the sixth switch is coupled to the second terminal of the third capacitor, a second terminal of the sixth switch receives the common voltage, and a control terminal of the sixth switch is controlled by the second control signal, so as to decide to turn on or turn off the sixth switch. A first terminal of the seventh switch is coupled to the second terminal of the sixth switch, a second terminal of the seventh switch is coupled to the second terminal of the fourth capacitor, and the control terminal of the seventh switch is coupled to the control terminal of the sixth switch, so as to decide to turn on or turn off the seventh switch according to the second control signal. An input terminal of the third buffer is coupled to the second terminal of the third capacitor, and an output terminal of the third buffer outputs the first coupling voltage. An input terminal of the fourth buffer is coupled to the second terminal of the fourth capacitor, and an output terminal of the fourth buffer outputs the second coupling voltage. During the enable period of the second control signal, the sixth switch and the seventh switch are turned on, so the third capacitor couples the common voltage, the touch voltage, and the average voltage, so as to generate the first coupling voltage, and the fourth capacitor couples the common voltage, the reset voltage, and the average voltage, so as to generate the second coupling voltage.

According to an embodiment of the present invention, the touch apparatus further includes an eighth switch. A first terminal of the eighth switch is coupled to the touch capacitor, a second terminal of the eighth switch is coupled to the grounding terminal, and a control terminal of the eighth switch is controlled by a reset signal. During an enable period of the reset signal, the eighth switch is turned on, so the voltage on the touch capacitor discharges through the eighth switch.

According to an embodiment of the present invention, the eighth switch includes a transistor. A drain terminal of the transistor is coupled to the touch capacitor, a gate terminal of the transistor receives the reset signal, and a source terminal of the transistor is coupled to a grounding terminal.

According to an embodiment of the present invention, the touch control unit further includes an analog-to-digital conversion unit. The analog-to-digital conversion unit is coupled to the signal processing unit, and is used for receiving the first coupling voltage and the second coupling voltage, and performing analog-to-digital conversion on the first coupling voltage and the second coupling voltage, so as to output a first digital signal and a second digital signal.

According to an embodiment of the present invention, the touch apparatus further includes a second touch capacitor, and the touch control unit further includes a second signal sampling and saving unit and a second switch unit. The second signal sampling and saving unit is coupled to the second touch capacitor and used for sampling and saving a voltage on the second touch capacitor during an enable period of a second sample signal to generate a second touch voltage, and sampling and saving the voltage on the second touch capacitor during an enable period of a second charge reset signal to generate a second reset voltage. The second signal sampling and saving unit further generates a second average voltage of the second touch voltage and the second reset voltage according to a second equalization signal. The second switch unit is coupled to the second signal sampling and saving unit and the signal processing unit, and is used for receiving and transmitting the second touch voltage, the second reset voltage and the second average voltage according to a third control signal. The signal processing unit receives the second touch voltage, the second reset voltage, and the second average voltage, and couples the second touch voltage, the second reset voltage, the second average voltage, and the common voltage according to the second control signal, so as to generate a third coupling voltage and a fourth coupling voltage.

Through the present invention, the signal sampling and saving unit samples and saves the voltage on the touch capacitor during the enable period of the sample signal, so as to generate the touch voltage, samples and saves the voltage on the touch capacitor during the enable period of the charge reset signal, so as to generate the reset voltage, and further generates the average voltage of the touch voltage and the reset voltage according to the equalization signal. Next, the touch voltage, the reset voltage, and the average voltage are transmitted to the signal processing unit respectively through the switch unit. Subsequently, the signal processing unit couples the touch voltage, the reset voltage, the average voltage, and the common voltage, so as to generate the first coupling voltage and the second coupling voltage. In this way, the noises during the signal transmission may be effectively reduced, and a low static current of the touch apparatus is guaranteed.

In order to make the aforementioned features and advantages of the present invention more comprehensible, the embodiments are described in detail below with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
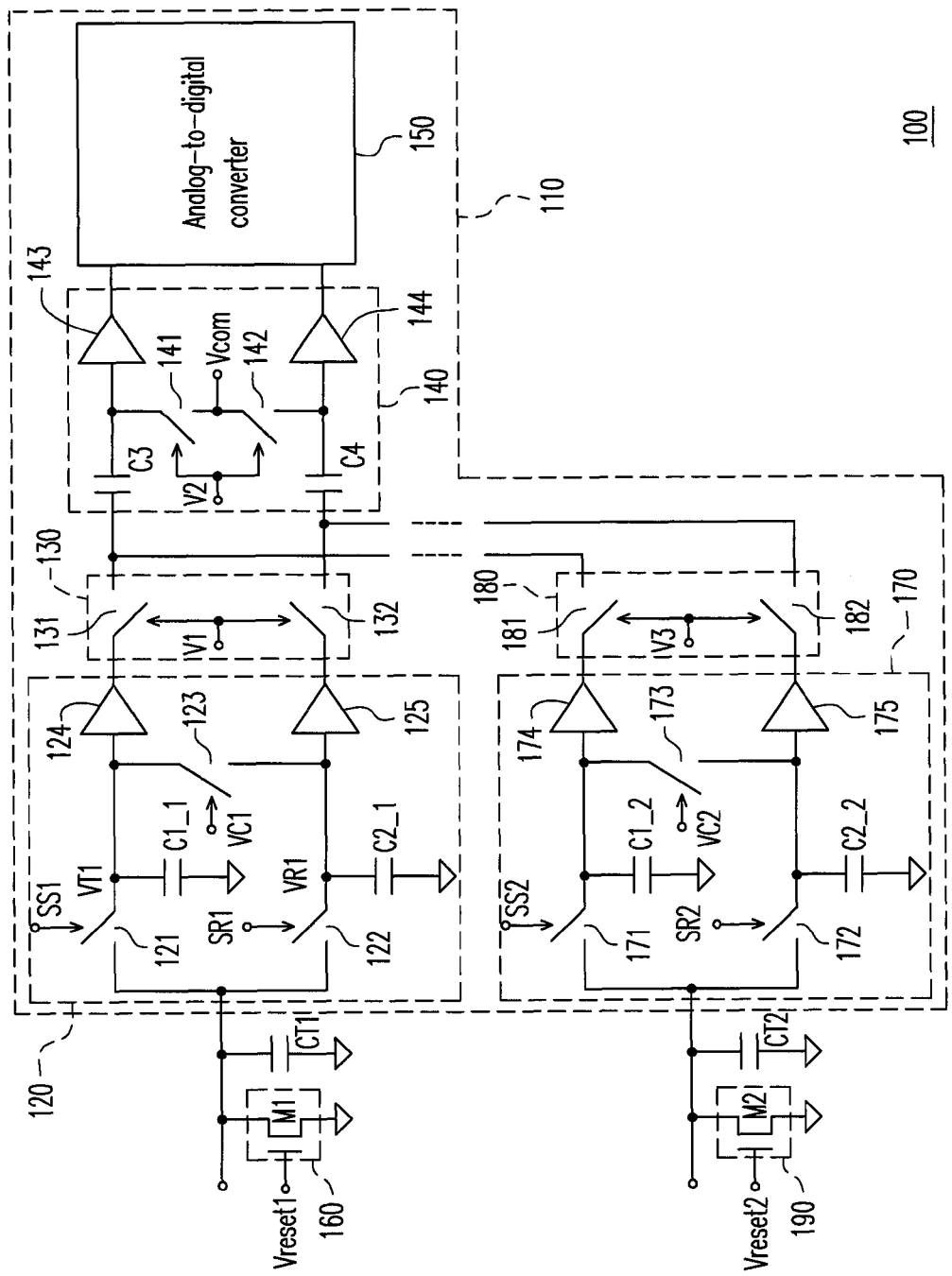
FIG. 1 is a schematic view of a touch apparatus according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic view of a touch apparatus according to an embodiment of the present invention. Referring to FIG. 1, the touch apparatus 100 includes a touch capacitor CT1 and a touch control unit 110. The touch control unit 110 includes a signal sampling and saving unit 120, a switch unit 130, and a signal processing unit 140. The touch capacitor CT1 is, for example, a touch pad (not shown) in a certain area of the touch apparatus 100, and is used for receiving a pressing information, and saving a corresponding voltage when a user presses the touch apparatus 100. The touch capacitor CT1 may store different voltage values according to a degree of pressing the touch apparatus 100 by the user.

The signal sampling and saving unit 120 is coupled to the touch capacitor CT1, and used for sampling and saving a voltage on the touch capacitor CT1 during an enable period of a sample signal SS1, so as to generate a touch voltage VT1, sampling and saving a voltage on the touch capacitor CT1 during an enable period of a charge reset signal SR1, so as to generate a reset voltage VR1, and further generate an average voltage of the touch voltage VT1 and the reset voltage VR1 according to an equalization signal VC1.

For example, when a user presses the touch apparatus 100, a voltage conversion unit (not shown) converts the information pressed by the user into a voltage, and the touch capacitor CT1 saves the voltage. At this time, the touch apparatus 100 enables the sample signal SS1, so the signal sampling and saving unit 120 samples and saves the voltage on the touch capacitor CT1 during the enable period of the sample signal SS1, so as to generate the touch voltage VT1. Next, the touch apparatus 100 disables the sample signal SS1, and discharges the voltage on the touch capacitor CT1, so that the touch capacitor CT1 receives next information pressed by the user. After the voltage on the touch capacitor CT1 finishes discharge, the touch apparatus 100 may enable a charge reset signal SR1, so that the signal sampling and saving unit 120 samples and saves the voltage on the touch capacitor CT1 during the enable period of the charge reset signal SR1, so as to generate the reset signal VR1.

The switch unit 130 is coupled to the signal sampling and saving unit 120, so as to receive and transmit the touch voltage VT1, the reset voltage VR1, and an average voltage according to a first control signal V1. The signal processing unit 140 is coupled to the switch unit 130, receives the touch voltage VT1, the reset voltage VR1, the average voltage, and a common voltage Vcom, and couples the touch voltage VT1, the reset voltage VR1, the average voltage, and the common voltage Vcom according to a second control signal V2, so as to generate a first coupling voltage and a second coupling voltage.

In this embodiment, the signal sampling and saving unit 120 includes switches 121, 122, and 123, capacitors C1_1 and C2_1, and buffers 124 and 125. A first terminal of the switch 121 receives the touch voltage VT1, and a control terminal of the switch 121 is controlled by the sample signal SS1, so as to decide to turn on or turn off the switch 121. For example, when the sample signal SS1 is enabled, the switch 121 is turned on, so as to transmit the voltage on the touch capacitor CT1; and when the sample signal SS1 is disabled, the switch 121 is turned off. A first terminal of the capacitor is coupled to a second terminal of the switch 121, a second terminal of the capacitor C1_1 is coupled to a grounding terminal. In addition, when the switch 121 is turned on, the capacitor C1_1 samples and saves the voltage on the touch capacitor CT1, so as to generate the touch voltage VT1.

A first terminal of the switch 122 receives the reset voltage VR1, and a control terminal of the switch 122 is controlled by the charge reset signal SR1, so as to decide to turn on or turn off the switch 122. For example, when the charge reset signal SR1 is enabled, the switch 122 is turned on, so as to transmit the voltage on the touch capacitor CT1; and when the charge reset signal SR1 is disabled, the switch 122 is turned off. A first terminal of the capacitor C2_1 in coupled to a second terminal of the switch 122, a second terminal of the capacitor C2_1 is coupled to a grounding terminal, and the capacitor C2_1 samples and saves the voltage on the touch capacitor CT1 when the switch 122 is turned on, so as to generate the reset voltage VR1.

A first terminal of the switch 123 is coupled to the first terminal of the capacitor C1_1, a second terminal of the switch 123 is coupled to the first terminal of the capacitor C2_2, and a control terminal of the switch 123 is controlled by the equalization signal VC1, so that the first terminal of the capacitor C1_1 and the first terminal of the capacitor C2_1 are coupled to each other, so as to generate the average voltage. That is to say, when the switch 123 is turned on, the first terminal of the capacitor C1_1 is connected to the first terminal of the capacitor C2_1, so that a charge sharing effect occurs to the touch voltage VT1 and the reset voltage VR1, so as to generate the average voltage, for example, (VT+VR)/2 .

The buffer 124 is coupled to the first terminal of the capacitor C1_1, and used for receiving the touch voltage VT1 and the average voltage, and outputting the touch voltage VT1 and the average voltage after buffering. The buffer 125 is coupled to the first terminal of the capacitor C2_1, and used for receiving the reset voltage VR1 and the average voltage, and outputting the reset voltage VR1 and the average voltage after buffering.

The switch unit 130 includes switches 131 and 132. A first terminal of the switch 131 is coupled to the signal sampling and saving unit 120, a second terminal the switch 131 is coupled to the signal processing unit 140, and a control terminal of the switch 131 is controlled by the first control signal V1, so as to decide to turn on or turn off the switch 131 to transmit the touch voltage VT1 and the average voltage. A first terminal of the switch 132 is coupled to the signal sampling and saving unit 120, a second terminal of the switch 132 is coupled to the signal processing unit 140, and a control terminal of the switch 132 is controlled by the first control signal V1, so as to decide to turn on or turn off the switch 132 to transmit the reset voltage VR1 and the average voltage.

The signal processing unit 140 includes capacitors C3 and C4, switches 141 and 142, and buffers 143 and 144. A first terminal of the capacitor C3 receives the touch voltage VT1 and the average voltage. A first terminal of the capacitor C4 receives the reset voltage VR1 and the average voltage. A first terminal of the switch 141 is coupled to a second terminal of the capacitor C3, a second terminal of the switch 141 receives the common voltage Vcom and a control terminal of the switch 141 is controlled by the second control signal V2, so as to decide to turn on or turn off the switch 141.

The first terminal of the switch 142 is coupled to the second terminal of the switch 141, the second terminal of the switch 142 is coupled to the second terminal of the capacitor C4, and the control terminal of the switch 142 is coupled to the control terminal of the switch 141, so as to decide to turn on or turn off the switch 142 according to the second control signal V2. An input terminal of the buffer 143 is coupled to a second terminal of the capacitor C3, and an output terminal of the buffer 143 outputs a first coupling voltage. An input terminal of the buffer 144 is coupled to the second terminal of the capacitor C4, and an output terminal of the buffer 144 outputs a second coupling voltage.

In this embodiment, during the enable period of the second control signal V2, the switch 141 and the switch 142 are turned on at the same time, so that the capacitor C3 couples the common voltage Vcom, the touch voltage VT1, and the average voltage, so as to generate the first coupling voltage, and the capacitor C4 couples the common voltage Vcom, the reset voltage VR1, and the average voltage, so as to generate the second coupling voltage.

In addition, the touch apparatus 100 in this embodiment further includes a switch 160. A first terminal of the switch 160 is coupled to the touch capacitor CT1, a second terminal of the switch 160 is coupled to a grounding terminal, and a control terminal of the switch 160 is controlled by a reset signal Vreset1. During the enable period of the reset signal Vreset1, the switch 160 is turned on, so that the voltage of the touch capacitor CT1 discharges through the switch 160. Moreover, the switch 160 includes a transistor M1. A drain terminal of the transistor M1 is coupled to the touch capacitor CT1, a gate terminal of the transistor receives a reset signal Vreset1, and a source terminal of the transistor M1 is coupled to the grounding terminal.

In addition, the touch control unit 110 in this embodiment further includes an analog-to-digital conversion unit 150. The analog-to-digital conversion unit 150 is coupled to the signal processing unit 140 and used for receiving the first coupling voltage and the second coupling voltage, and performs analog-to-digital conversion on the first coupling voltage and the second coupling voltage, so as to output a first digital signal and a second digital signal. Next, the first digital signal and the second digital signal are transmitted to a back end circuit, so as to perform the subsequent process, and thus the corresponding information of touching the touch apparatus 100 in this embodiment by the user is reflected.

The above description approximately describes the detailed circuit, coupling relations, and corresponding operations of the touch apparatus 100 in this embodiment. The operation of the touch apparatus 100 is described in the following with reference to the sequence diagram of the signals.

Figure 2:
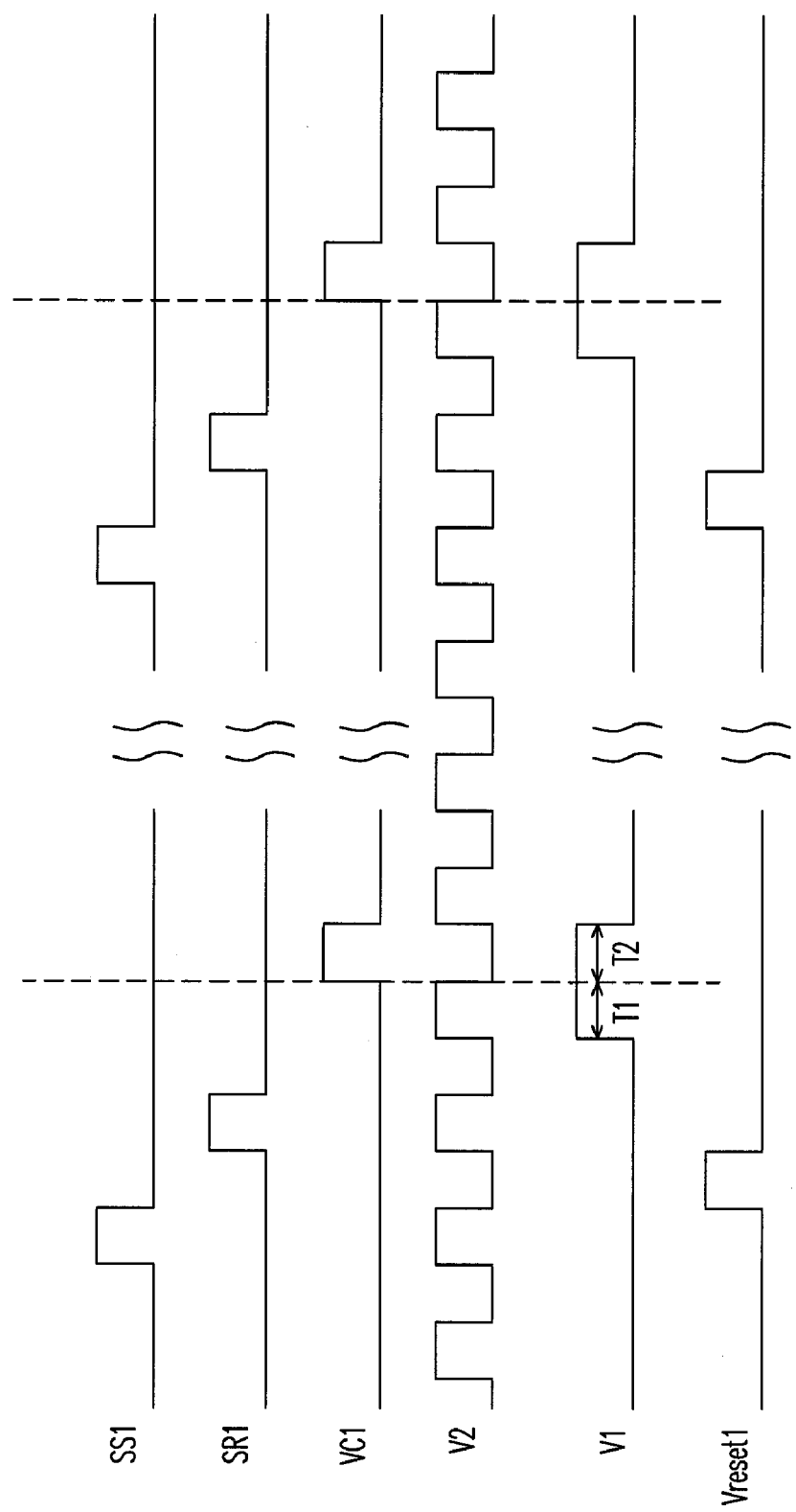
FIG. 2 is a sequence diagram of a sample signal, a charge reset signal, an equalization signal, a first control signal, and a second control signal according to an embodiment of the present invention.

FIG. 2 is a sequence diagram of a sample signal SS1, a charge reset signal SR1, an equalization signal VC1, a first control signal V1, and a second control signal V2 according to an embodiment of the present invention. Referring to FIG. 1 in combination with FIG. 2, first, when the user presses the touch apparatus 100, the touch apparatus 100 converts the information pressed by the user into a voltage to be stored on the touch capacitor CT1. Next, the touch apparatus 100 enables the sample signal SS1, so that the switch 121 is turned on, and the capacitor C1_1 samples and saves the voltage on the touch capacitor CT1, so as to generate a touch voltage VT1.

Subsequently, the touch apparatus 100 enables a reset signal Vreset1, so that the transistor M1 of the switch 160 is turned on, and the voltage on the touch capacitor CT1 discharges to a ground voltage level through the transistor Ml, so the touch capacitor CT1 may store a converted voltage next time the user presses the touch apparatus 100. Next, the touch apparatus 100 enables the charge reset signal SR1, so that the switch 122 is turned on, and the capacitor C2_1 samples and saves the voltage on the touch capacitor CT1, so as to generate a reset voltage VR1.

Subsequently, the touch apparatus 100 enables the first control signal V1, so that the switches 131 and 132 are turned on, and the touch voltage VT1 and the reset voltage VR1 are transmitted through the switch unit 130. In another aspect, in a sub-enable period T1 of the first control signal V1, the touch apparatus 100 enables the second control signal V2, so that the switches 141 and 142 are turned on, and the second terminals of the capacitor C3 and C4 receive the common voltage Vcom. The capacitor C3 first couples the touch voltage VT and the common voltage Vcom to generate a voltage VT1+Vcom, and the capacitor C4 first couples the reset voltage VR1 and the common voltage Vcom to generate a voltage VR1+Vcom. Next, in a sub-enable period T2 of the first control signal V1, the touch apparatus 100 enables the equalization signal VC1, so that the switch 123 is turned on and a discharge sharing effect occurs to the touch voltage VT1 and the reset voltage VR1, so as to generate an average voltage ((VT1+VR1)/2) of the touch voltage VT1 and the reset voltage VR1.

As the switch 131 and 132 are still turned on, the average voltage is transmitted to the capacitors C3 and C4 through the buffer 124 and the switch 131 and through the buffer 125 and the switch 132 respectively. Next, the capacitor C3 couples the voltage VT1+Vcom and the average voltage (VT1+VR1)/2 to generate the first coupling voltage, that is, VT1+Vcom−(VT1+VR1)/2=Vcom+(VT1−VR1)/2. The capacitor C4 couples the voltage VR1+Vcom and the average voltage (VT1+VR1)/2 to generate the second coupling voltage, that is, VR1+Vcom1−(VT1+VR1)/2=Vcom+(VR1−VT1)/2. Next, the first coupling voltage and the second coupling voltage are transmitted to an analog-to-digital converter 150, so as to perform analog-to-digital conversion on the first coupling voltage and the second coupling voltage, thus generating a first digital signal and a second digital signal. Next, the first digital signal and the second digital signal are transmitted to a back end circuit, so as to perform a corresponding subsequent process. In this way, In this embodiment, the noises during the signal transmission may be effectively reduced since the first coupling voltage and the second voltage are relative voltages, and a low static current of the touch apparatus 100 is guaranteed since the touch apparatus 100 doesn't apply any resistors.

In addition, in this embodiment, the touch apparatus 100 further includes a touch capacitor CT2, and the touch control unit 110 further includes a signal sampling and saving unit 170 and a switch unit 180.

The signal sampling and saving unit 170 is coupled to a touch capacitor CT2I and used for sampling and saving a voltage on the touch capacitor CT2 during an enable period of a sample signal SS2, so as to generate a touch voltage VT2, and sampling and saving a voltage on the touch capacitor CT2 during an enable period of a charge reset signal, so as to generate a reset voltage VR2. The signal sampling and saving unit 170 further generates an average voltage of the touch voltage VT2 and the reset voltage according to an equalization signal VC2. The switch unit 180 is coupled to the signal sampling and saving unit 170, so as to receive and transmit the touch voltage VT2, the reset voltage VR2, and the average voltage to the signal processing unit 140 according to a third control signal V3. The signal processing unit 140 receives the touch voltage VT2, the reset voltage VR2, and the average voltage, and couples the touch voltage VT2, the reset voltage VR2, the average voltage, and the common voltage Vcom according to the second control signal V2, so as to generate a third coupling voltage and a fourth coupling voltage. The third coupling voltage and the fourth coupling voltage are transmitted to the analog-to-digital conversion circuit 150 to perform the analog-to-digital conversion, so as to generate a third digital signal and a fourth digital signal, thus performing a corresponding subsequent process.

In addition, the operation manner of the signal sampling and saving unit 170, the switch unit 180, and the switch 190 and the coupling relations of the internal components thereof may be referred to the relevant description of the signal sampling and saving unit 120, the switch unit 130, and the switch 160, and the description thereof is omitted here. In this way, in the case of the common signal processing unit 140 in this embodiment, the noises during the signal transmission from the signal sampling and saving units 170 and 180 to the signal processing unit 140 are effectively reduced.

That is, the noises during the process of parallel to serial are reduced, and a low static current of the touch apparatus 100 is guaranteed.

In conclusion, through the embodiments of the present invention, the signal sampling and saving unit samples and saves the voltage on the touch capacitor during the enable period of the signal sampling, so as to generate the touch voltage, and samples and saves the voltage on the touch capacitor during the enable period of the charge reset signal, so as to generate the reset voltage, and further generate an average voltage of the touch voltage and the reset voltage according to the equalization signal. Next, the switch unit transmits the touch voltage, the reset voltage, and the average voltage to the signal processing unit. Next, the signal processing unit couples the touch voltage, the reset voltage, the average voltage, and the common voltage, so as to generate the first coupling voltage and the second coupling voltage. In this way, the noises during the signal transmission may be effectively reduced, and a low static current of the touch apparatus is guaranteed. In addition, in the case of the common signal processing unit in this embodiment of the present invention, the noises during the signal transmission from the plurality of signal sampling and saving units to the signal processing unit are effectively reduced. That is, the noises during the process of parallel to serial are reduced, and a low static current of the touch apparatus is still guaranteed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch apparatus, comprising a touch capacitor, and the touch apparatus comprising:
    a touch control unit, comprising:
    a signal sampling and saving unit, coupled to the touch capacitor, and used for sampling and saving a voltage on the touch capacitor during an enable period of a sample signal to generate a touch voltage, and sampling and saving a voltage on the touch capacitor during an enable period of a charge reset signal to generate a reset voltage, wherein the signal sampling and saving unit further generates an average voltage of the touch voltage and the reset voltage according to an equalization signal;

a switch unit, coupled to the signal sampling and saving unit, and used for receiving and transmitting the touch voltage, the reset voltage, and the average voltage according to a first control signal; and a signal processing unit, coupled to the switch unit, and used for receiving the touch voltage, the reset voltage, the average voltage, and a common voltage, and coupling the touch voltage, the reset voltage, the average voltage, and the common voltage according to a second control signal, so as to generate a first coupling voltage and a second coupling voltage.

2. The touch apparatus according to claim 1, wherein the signal sampling and saving unit comprises:

a first switch, comprising a first terminal receiving the touch voltage, and a control terminal controlled by the sample signal, so as to decide to turn on or turn off the first switch;

a first capacitor, comprising a first terminal coupled to a second terminal of the first switch, and a second terminal coupled to a grounding terminal, so as to save the touch voltage;

a second switch, comprising a first terminal receiving the reset voltage, and a control terminal controlled by the charge reset signal, so as to decide to turn on or turn off the second switch;

a second capacitor, comprising a first terminal coupled to a second terminal of the second switch, and a second terminal coupled to a grounding terminal, so as to save the reset voltage;

a third switch, comprising a first terminal coupled to the first terminal of the first capacitor, a second terminal coupled to the first terminal of the second capacitor, and a control terminal controlled by the equalization signal, so that the first terminal of the first capacitor and the first terminal of the second capacitor are coupled to each other to generate the average voltage;

a first buffer, coupled to the first terminal of the first capacitor, so as to receive and output the touch voltage and the average voltage; and a second buffer, coupled to the first terminal of the second capacitor, so as to receive and output the reset voltage and the average voltage.

3. The touch apparatus according to claim 1, wherein the switch unit comprises:

a fourth switch, comprising a first terminal coupled to the signal sampling and saving unit, a second terminal coupled to the signal processing unit, and a control terminal controlled by the first control signal, so as to decide to turn on or turn off the fourth switch, and transmit the touch voltage and the average voltage; and a fifth switch, comprising a first terminal coupled to the signal sampling and saving unit, a second terminal coupled to the signal processing unit, and a control terminal controlled by the first control signal, so as to decide to turn on or turn off the fifth switch, and transmit the reset voltage and the average voltage.

4. The touch apparatus according to claim 1, wherein the signal processing unit comprises:

a third capacitor, comprising a first terminal receiving the touch voltage and the average voltage;

a fourth capacitor, comprising a first terminal receiving the reset voltage and the average voltage;

a sixth switch, comprising a first terminal coupled to a second terminal of the third capacitor, a second terminal receiving the common voltage, and a control terminal controlled by the second control signal, so as to decide to turn on or turn off the sixth switch;

a seventh switch, comprising a first terminal coupled to the second terminal of the sixth switch, a second terminal coupled to a second terminal of the fourth capacitor, and a control terminal coupled to the control terminal of the sixth switch, so as to decide to turn on or turn off the seventh switch according to the second control signal;

a third buffer, comprising an input terminal coupled to the second terminal of the third capacitor, and an output terminal outputting the first coupling voltage; and a fourth buffer, comprising an input terminal coupled to the second terminal of the fourth capacitor, and an output terminal outputting the second coupling voltage; wherein during the enable period of the second control signal, the sixth switch and the seventh switch are turned on, so the third capacitor couples the common voltage, the touch voltage, and the average voltage, so as to generate the first coupling voltage, and the fourth capacitor couples the common voltage, the reset voltage, and the average voltage, so as to generate the second coupling voltage.

5. The touch apparatus according to claim 1, further comprising:

an eighth switch, comprising a first terminal coupled to the touch capacitor, a second terminal coupled to a grounding terminal, and a control terminal controlled by a reset signal; wherein an enable period of the reset signal is between the enable period of the sample signal and the enable period of the charge reset signal, and the eighth switch is turned on during the enable period of the reset signal, so the voltage on the touch capacitor discharges through the eighth switch.

6. The touch apparatus according to claim 5, wherein the eighth switch comprises:

a transistor, comprising a drain terminal coupled to the touch capacitor, a gate terminal coupled to the reset signal, and a source terminal coupled to the grounding terminal.

7. The touch apparatus according to claim 1, wherein the touch control unit further comprises:

an analog-to-digital conversion unit, coupled to the signal processing unit, and used for receiving the first coupling voltage and the second coupling voltage, and performing analog-to-digital conversion on the first coupling voltage and the second coupling voltage, so as to output a first digital signal and a second digital signal.

8. The touch apparatus according to claim 1, wherein the touch apparatus further comprises a second touch capacitor, and the touch control unit further comprises:

a second signal sampling and saving unit, coupled to the second touch capacitor, and used for sampling and saving a voltage on the second touch capacitor during an enable period of a second sample signal to generate a second touch voltage, and sampling and saving a voltage on the second touch capacitor during an enable period of a second charge reset signal to generate a second reset voltage, wherein the second signal sampling and saving unit further generates a second average voltage of the second touch voltage and the second reset voltage according to a second equalization signal;

a second switch unit, coupled to the second signal sampling and saving unit and the signal processing unit, so as to receive and transmit the second touch voltage, the second reset voltage, and the second average voltage according to a third control signal; wherein the signal processing unit receives the second touch voltage, the second reset voltage, and the second average voltage, and couples the second touch voltage, the second reset voltage, the second average voltage, and the common voltage according to the second control signal, so as to generate a third coupling voltage and a fourth coupling voltage.

* * * * *